(12) United States Patent
Ito

(10) Patent No.: US 6,353,239 B1
(45) Date of Patent: Mar. 5, 2002

(54) SEMICONDUCTOR INTEGRATED CIRCUIT DEVICE

(75) Inventor: Satoshi Ito, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/586,843

(22) Filed: Jun. 5, 2000

(51) Int. Cl.[7] .............................................. H01L 27/10
(52) U.S. Cl. ...................... 257/203; 257/202; 257/409; 326/80; 327/108; 327/333
(58) Field of Search ................................ 257/202, 203, 257/204, 206, 409, 410; 327/108, 333; 326/80, 81

(56) References Cited

U.S. PATENT DOCUMENTS

| | | | | |
|---|---|---|---|---|
| 4,727,266 A | * | 2/1988 | Fuji et al. ..................... | 307/443 |
| 4,945,395 A | * | 7/1990 | Suehiro ........................ | 357/40 |
| 5,153,698 A | * | 10/1992 | Hirabayashi et al. ......... | 357/45 |
| 5,387,809 A | * | 2/1995 | Yamagishi et al. ......... | 257/203 |
| 5,780,881 A | * | 7/1998 | Matsuda et al. ............ | 257/202 |

FOREIGN PATENT DOCUMENTS

JP 59231869 A * 12/1984

* cited by examiner

*Primary Examiner*—Minh Loan Tran
*Assistant Examiner*—Remmon R. Fordé
(74) *Attorney, Agent, or Firm*—Hogan & Hartson, L.L.P.

(57) ABSTRACT

A semiconductor integrated circuit device having a port functioning as at least one of an input port and an output port, and can operates at high speed is provided. The port is divided into a first region in which a voltage of 3V is applied to the gate electrode and a second region in which a voltage of 3V or 5V is applied to the gate electrode. The thickness of gate oxide film of a MOS field effect transistor located in the first region is designed to be relatively small. The thickness of gate oxide film of a MOS field effect transistor located in the second region is designed to be relatively large. The regions operating at a voltage of 3V (the first region) and the regions operating at a voltage of 3V or 5V (the second region) are regularly divided.

33 Claims, 3 Drawing Sheets

FIG. 3
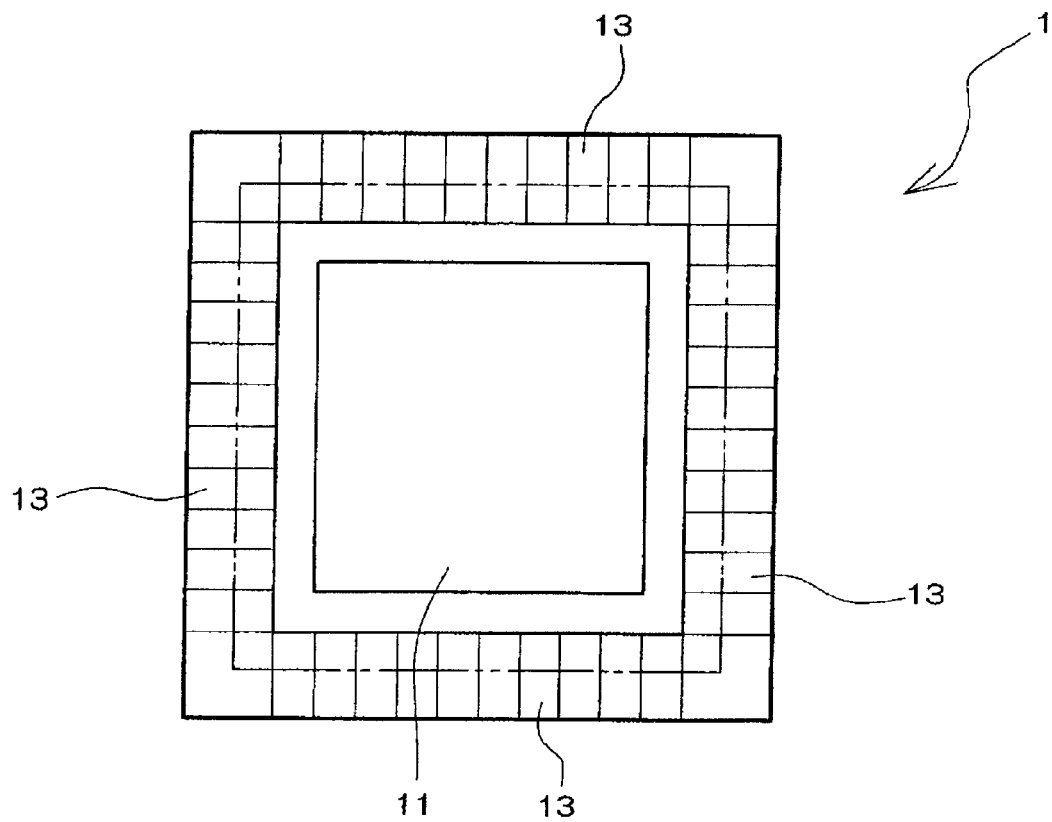
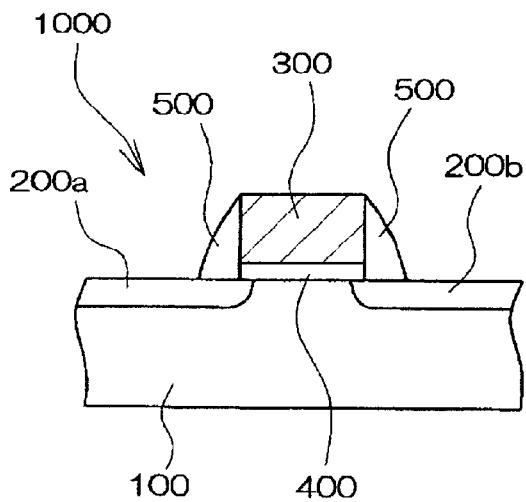
FIG. 4A
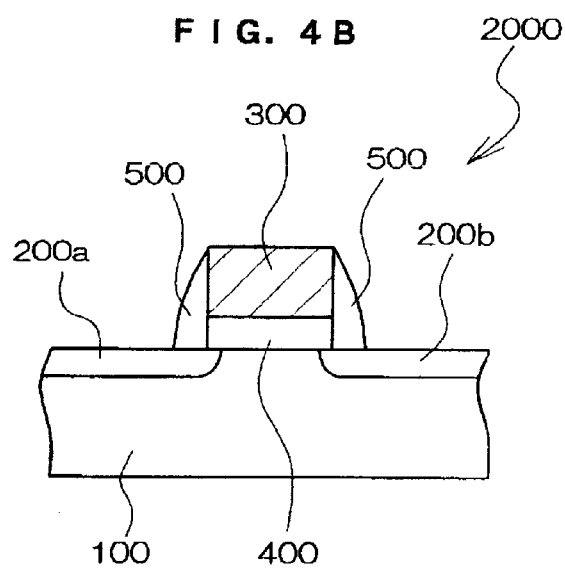
FIG. 4B

SEMICONDUCTOR INTEGRATED CIRCUIT DEVICE

BACKGROUND OF THE INVENTION

1. Field of the Invention

The present invention relates to an input/output port of a semiconductor integrated circuit device.

2. Description of the Related Art

When a semiconductor integrated circuit device transfers signals to and from an external device (an input/output device or another semiconductor integrated circuit device), the circuit of the semiconductor integrated circuit device may have an operating voltage that is different from that of the external device. In such a case, the voltage is converted by a voltage converting section provided in the input/output port of the semiconductor integrated circuit device.

SUMMARY OF THE INVENTION

An object of the present invention is to provide a semiconductor integrated circuit device having a port that functions as at least one of an input port and an output port, and that can operate at a high speed.

(1) In accordance with one embodiment of the present invention, a master slice type semiconductor integrated circuit device comprises a semiconductor substrate on which a circuit section is formed, and a port section connected with the circuit section. In one aspect, the port section functions as at least one of an input port and an output port. The port section may be provided with a voltage converting section for converting a first voltage into a second voltage that differs from the first voltage. The voltage converting section includes a first section having a first field effect transistor, and a second section having a second field effect transistor. A gate insulating layer of the first field effect transistor has a film thickness which differs from a film thickness of a gate insulating layer of the second field effect transistor.

When the thickness of the gate insulating layer is unnecessarily large, the operation of the field effect transistor becomes slow because the channel forming speed slows down. The gate insulating layer of the first field effect transistor in the first section of the voltage converting section has the thickness which differs from that of the gate insulating layer of the second field effect transistor in the second section of the voltage converting section. As a result, the thickness of the gate insulating layer that matches a given voltage can be selected in the voltage converting section. The operating speed of the port section can thus be increased.

The circuit section may be any one of a logic circuit, ROM, RAM, or analog circuit, or a combination of these.

(2) In one embodiment, the voltage converting section may function as an output port and include a predriver for inputting and outputting a first voltage signal, and a driver for inputting and outputting a second voltage signal. The predriver has a wave shaping function for a signal transmitted from the circuit section. An external input device, output device, input/output device, or another semiconductor integrated circuit device are driven by the driver.

(3) In one embodiment, the voltage converting section may comprise a level shifter; the first section of the voltage converting section may comprise a first part of the level shifter; the first voltage signal may be input in and output from the first part of the level shifter; the second section of the voltage converting section may comprise a second part of the level shifter; and the first voltage signal may be input in and the second voltage signal may be output from the second part of the level shifter. The level shifter is an example of a voltage converting section.

(4) In one embodiment, the predriver may be connected with the circuit section and the first part of the level shifter, and the driver may be connected with the second part of the level shifter.

(5) In one embodiment, the thickness of a gate insulating layer of the field effect transistor being a component of the predriver may be equal to (or substantially the same as) the thickness of a gate insulating layer of the first field effect transistor being a component of the level shifter. Also, the thickness of a gate insulating layer of the field effect transistor being a component of the driver may be equal to (or substantially the same as) the thickness of a gate insulating layer of the second field effect transistor being a component of the level shifter. In one embodiment, the gate insulating layers of field effect transistors in which the same voltage is applied to their respective gate electrodes may have the same thickness.

(6) In one embodiment, the circuit section may be operated by the first voltage; and the thickness of a gate insulating layer of the field effect transistor being a component of the circuit section, the thickness of the gate insulating layer of the field effect transistor being the component of the predriver, and the thickness of the gate insulating layer of the first field effect transistor being the component of the first part of the level shifter may be equal to one another. In one embodiment, the gate insulating layers of field effect transistors in which the same voltage is applied to their respective gate electrodes may have the same thickness.

(7) In one embodiment, a region where the predriver and the first part of the level shifter are formed may be located between a region where the circuit section is formed and a region where the driver and the second part of the level shifter are formed.

The semiconductor integrated circuit device has many regions where various field effect transistors are formed. For example, in one region, the first voltage is applied to gate electrodes of the filed effect transistors (e.g., the predriver and the first part of the level shifter, and the circuit section). In another region, the second voltage is applied to gate electrodes of the field effect transistors (e.g., the driver and the second part of the level shifter). In accordance with the present invention, these regions can be disposed with reduced complexity. Accordingly, the device structure achieved by the present invention is advantageous in a gate array and an embedded array.

(8) In one embodiment, on the semiconductor substrate, the region where the predriver and the first part of the level shifter are formed may be located outside the region where the circuit section is formed. Further, the region where the driver and the second part of the level shifter are formed may be located outside the region where the predriver and the first part of the level shifter are formed.

(9) In one embodiment, the port section functions as an input port.

(10) In one embodiment, the voltage converting section may comprise a level shifter. In this embodiment, the first section of the voltage converting section may comprise a second part of the level shifter; and the first voltage signal may be input into and output from the second part of the level shifter. The second section of the voltage converting section may comprise a first part of the level shifter; and the second voltage signal may be input into and the first voltage signal may be output from the first part of the level shifter. The level shifter is an example of a voltage converting section.

(11) In one embodiment, the circuit section may be operated by the first voltage. In this embodiment, the thickness of a gate insulating layer of the field effect transistor being a component of the circuit section may be equal to the thickness of a gate insulating layer of the first field effect transistor being a component of the second part of the level shifter. In one embodiment, the gate insulating layers of field effect transistors that are operated with the same operating voltage may have the same thickness.

(12) In one embodiment, a region where the second part of the level shifter is formed may be located between a region where the circuit section is formed and a region where the first part of the level shifter is formed.

As a result, the this embodiment reduces the complexity in arranging regions where various field effect transistors that are operated with the first voltage and the second voltage are formed. For example, in one of the regions, the first voltage is applied to gated electrodes of the field effect transistors (e.g., the second part of the level shifter and the circuit section). In another region, the second voltage is applied to gate electrodes of the field effect transistors (e.g., the first part of the level shifter). These regions can be arranged with a less complexity. This brings about an advantage in the use of a gate array and an embedded array.

(13) In one embodiment, on the semiconductor substrate, the region where the second part of the level shifter is formed may be located outside the region where the circuit section is formed. Also, the region where the first part of the level shifter is formed may be located outside the region where the second part of the level shifter is formed.

(14) In one embodiment, the port section may function as an input port and an output port.

(15) In one embodiment, the port section may be provided with another voltage converting section; the input port of the port section may comprise the other voltage converting section; and the output port of the port section may comprise the voltage converting section.

(16) In one embodiment, the other voltage converting section may comprise a first section having a third field effect transistor, and a second section having a fourth field effect transistor. The gate insulating layer of the third field effect transistor may have the same thickness as the gate insulating layer of the first field effect transistor. The gate insulating layer of the fourth field effect transistor may have the same thickness as the gate insulating layer of the second field effect transistor. The gate insulating layers of field effect transistors in which the same voltage is applied to their gate electrodes may have the same thickness.

(17) In one embodiment, the voltage converting section may comprise a level shifter. The first section of the voltage converting section may comprise the first part of the level shifter, and the first voltage signal may be input into and output from the first part of the level shifter. The second section of the voltage converting section may comprise the second part of the level shifter; and the first voltage signal may be input into and the second voltage signal may be output from the second part of the level shifter. The first section of the other voltage converting section may comprise the second part of the other level shifter; and the first voltage signal may be input into and output from the second part of the other level shifter. The second section of the other voltage converting section may comprise a first part of the other level shifter; and the second voltage signal may be input into and the first voltage signal may be output from the first part of the other level shifter. The level shifter is an example of the voltage converting section, and the other level shifter is an example of the other voltage converting section.

(18) In one embodiment, the port section may comprise a predriver for inputting and outputting a first voltage, and a driver for inputting and outputting a second voltage. The input port of the port section may comprise the other level shifter; and the output port of the port section may comprise the predriver, the driver, and the level shifter.

(19) In one embodiment, the predriver may be connected with the circuit section and the first part of the level shifter; and the driver may be connected with the second part of the level shifter.

(20) In one embodiment, the thickness of a gate insulating layer of the field effect transistor being a component of the predriver, the thickness of a gate insulating layer of the first field effect transistor being a component of the first part of the level shifter, and the thickness of a gate insulating layer of the third field effect transistor being a component of the second part of the other level shifter, may be equal to one another. Also, the thickness of a gate insulating layer of the field effect transistor being a component of the driver, the thickness of a gate insulating layer of the second field effect transistor being a component of the second part of the level shifter, and the thickness of a gate insulating layer of the fourth field effect transistor being a component of the first part of the other level shifter, may be equal to one another. The gate insulating layers of field effect transistors in which the same voltage is applied to their gate electrodes may have the same thickness.

(21) In one embodiment, the circuit section may be operated by the first voltage. In this embodiment, the thickness of a gate insulating layer of the field effect transistor being a component of the circuit section, the thickness of the gate insulating layer of the field effect transistor being the component of the predriver, and the thickness of the gate insulating layer of the first field effect transistor being the component of the first part of the level shifter, and the thickness of the gate insulating layer of the third field effect transistor being the component of the second part of the other level shifter, may be equal to one another. The gate insulating layers of field effect transistors in which the same voltage is applied to their gate electrodes may have the same thickness.

(22) In one embodiment, a region where the predriver, the first part of the level shifter, and the second part of the other level shifter are formed may be located between a region where the circuit section is formed and a region where the driver, the second part of the level shifter, and the first part of the other level shifter are formed.

This embodiment reduces the complexity in arranging regions where various field effect transistors that are operated with the first voltage and the second voltage are formed. For example, in one of the regions, the first voltage is applied to gated electrodes of the field effect transistors (e.g., the circuit section, the predriver, the first part of the level shifter, and the second part of the other level shifter). In another region, the second voltage is applied to gate electrodes of the field effect transistors (e.g., the second part of the level shifter, the first part of the other level shifter, and the driver). These regions can be arranged with a less complexity. This brings about an advantage in the use of a gate array and an embedded array.

(23) In one embodiment, on the semiconductor substrate, the region where the predriver, the first part of the level shifter, and the second part of the other level shifter are formed may be located outside the region where the circuit section is formed. Also, the region where the driver, the second part of the level shifter, and the first part of the other level shifter are formed may be located outside the region where the predriver, the first part of the level shifter, and the second part of the other level shifter are formed.

(24) In one embodiment, each of the circuit section and the port section may comprise at least one of a gate array and an embedded array.

(25) In one embodiment, the semiconductor integrated circuit device may comprise another port section. The other port section may have a function of not converting a voltage.

When an external device (an input device, an output device, and an input/output device, or another semiconductor integrated circuit device) has the same operating voltage as the circuit section of the semiconductor integrated circuit device of the present invention, signals are transferred through the other port section. When an external device has an operating voltage that differs from the operating voltage of the circuit section of the semiconductor integrated circuit device of the present invention, signals are transferred through the port section.

(26) In one embodiment, the other port section may be provided with a predriver and another driver, and may have a function as an output port.

(27) In one embodiment, the thickness of a gate insulating layer of the field effect transistor being a component of the other predriver, the thickness of the gate insulating layer of the field effect transistor being the component of the predriver, and the thickness of the gate insulating layer of the first field effect transistor being the component of the first part of the level shifter may be equal to one another. Also, the thickness of a gate insulating layer of the field effect transistor being a component of the other driver, the thickness of the gate insulating layer of the field effect transistor being the component of the driver, and the thickness of the gate insulating layer of the second field effect transistor being the component of the second part of the level shifter may be equal to one another. The gate insulating layers of field effect transistors in which the same voltage is applied to their gate electrodes may have the same thickness.

(28) In one embodiment, the second voltage may be greater than the first voltage; and the thickness of the gate insulating layer of the second field effect transistor may be greater than the thickness of the gate insulating layer of the first field effect transistor. Both the first field effect transistor and the second field effect transistor of the present invention can operate at high speed, while preventing breakage of gate insulating layers.

(29) A master slice type semiconductor integrated circuit device of another aspect of the present invention comprises a semiconductor substrate on which a circuit section is formed, and a port section that is connected with the circuit section and functions as at least an output port. In accordance with the embodiment, the port section has a function of converting a first voltage into a second voltage that differs from the first voltage. The port section includes a first section having a first field effect transistor, and a second section having a second field effect transistor. A gate insulating layer of the first field effect transistor has a film thickness that differs from a film thickness of a gate insulating layer of the second field effect transistor.

When the thickness of the gate insulating layer is unnecessarily large, the operation of the field effect transistor becomes slow because the channel forming speed slows down. In one embodiment, the gate insulating layer of the first field effect transistor in the first section has the thickness which differs from that of the gate insulating layer of the second field effect transistor in the second section. Therefore, the thickness of the gate insulating layer that matches a given voltage can be selected in the port section. The operating speed of the port section can thus be increased.

(30) In one embodiment, the port section may be provided with a predriver and a driver; a first voltage signal may be input into and output from the predriver; and the driver may have a function of converting the first voltage into a second voltage which differs from the first voltage, and the first voltage signal may be input into and a second voltage signal may be output from the driver.

(31) In one embodiment, the predriver may comprise the first section having the first field effect transistor; and the driver may comprise the second section having the second field effect transistor.

(32) In one embodiment, a region where the predriver is formed may be located between a region where the circuit section is formed and a region where the driver is formed.

(33) In one embodiment, on the semiconductor substrate, the region where the predriver is formed may be located outside the region where the circuit section is formed, and the region where the driver is formed may be located outside the region where the predriver is formed.

BRIEF DESCRIPTION OF THE DRAWINGS

FIG. 3 is a plan view of a semiconductor integrated circuit device of this embodiment of the present invention.

FIGS. 4A and 4B are sectional views of one example of a MOS field effect transistor used for this embodiment of the present invention.

DESCRIPTION OF PREFERRED EMBODIMENT OF THE INVENTION

Figure 1:
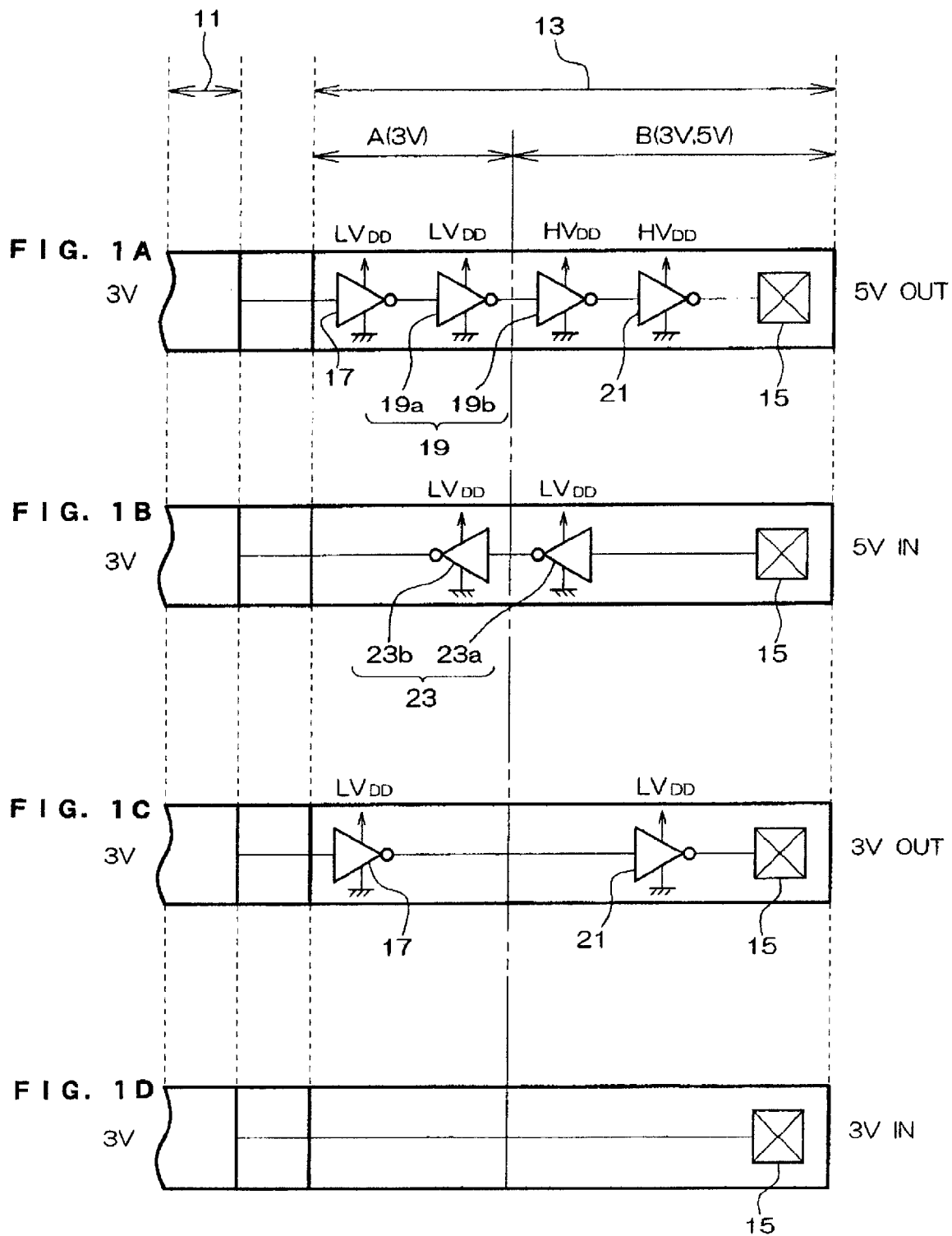
FIGS. 1A to 1D are drawings showing circuit configurations of a port of an embodiment of the present invention.

The present invention will now be described by way of an embodiment. An outline of this embodiment will first be explained, then the details will be discussed.

In this embodiment, a port functioning as at least one of an input port and an output port is divided into a section operating at 3V (a section having a gate electrode voltage of 3V) and a section operating at 3V or 5V (a section having a gate electrode voltage of 3V or 5V). The thickness of a gate oxide film of a MOS field effect transistor located in the section operating at 3V is designed comparatively small. The thickness of gate oxide film of a MOS field effect transistor located in the section operating at 3V or 5V is designed comparatively large. Because the thickness of the gate oxide film of a MOS field effect transistor located in the section operating at 3V is comparatively small, this section can be operated at high speed. A high speed for the port can be ensured in this manner. In addition, the sections operating at 3V and the sections operating at 3V or 5V are arranged regularly. A gate array and an embedded array can be applied also to the port in this manner.

The embodiment of the present invention will be explained in detail with reference to the accompanying drawings. FIG. 3 is a plan view of a semiconductor integrated circuit device 1 in accordance with the embodiment of the present invention. The semiconductor integrated circuit device 1 is provided with a circuit section 11 such as a logic circuit, ROM, RAM, or analog circuit, and a plurality of ports 13 functioning as at least one of an input port and an output port. The circuit section 11 and the ports 13 are formed on a semiconductor substrate chip (for example, a silicon substrate). The ports 13 are arranged around the circuit section 11. The semiconductor integrated circuit device 1 is a master slice type such as a gate array or an embedded array. Specifically, the semiconductor integrated circuit device 1 is manufactured by interconnecting wiring segments that are pre-formed on a semiconductor substrate according to the requirements of the user, so that the circuit section 11 and ports 13 are formed according to the requirements of the user.

The semiconductor integrated circuit device 1 is connected with two external devices. An external device means an input device, an output device, an input/output device, or another semiconductor integrated circuit device, for example. One external device is operated at a comparatively high voltage (for example, 5V), and another external device is operated at a comparatively low voltage (for example, 3V). Thus, two different voltages are used for operating the semiconductor integrated circuit device 1.

Specifically, signals with a voltage of 5v or 3V flow through the ports 13, and signals with a voltage of 3V flow through the circuit section 11.

Because the external device operated at 5V has an operating voltage that differs from the operating voltage of the circuit section 11, the voltage is converted at the ports 13.

Figure 2:
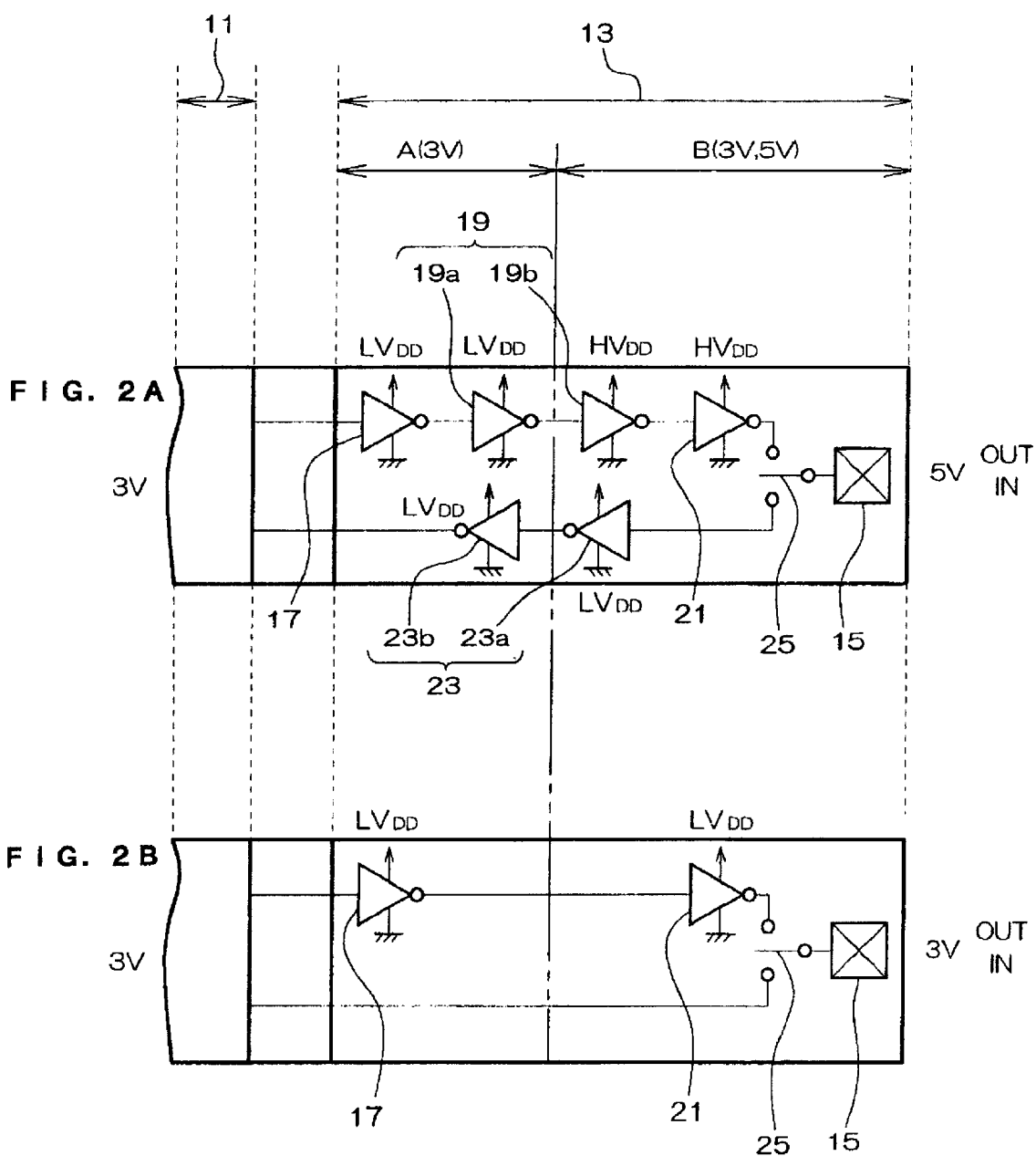
FIGS. 2A and 2B are drawings showing other circuit configurations of a port of this embodiment of the present invention.

The structure of the circuit of the ports 13 will be explained. FIGS. 1 and 2 show circuit configurations of the ports 13. Six types of the ports 13 are shown in FIGS. 1A to 1D and 2A and 2B. Although not shown in the drawings, the input ports are provided with a voltage level judgement circuit between a driver and a level shifter. The voltage level judgement circuit judges whether the voltage of a signal is "1" or "0".

The port 13 of FIG. 1A is an output port (output cell). In this configuration, the port 13 converts signals with a voltage of 3V from the circuit section 11 into 5V, and outputs to an external device through a pad electrode 15. More specifically, the port 13 of FIG. 1A comprises a predriver 17, a level shifter 19, and a driver 21.

The predriver 17 rectifies the waveform of signals from the circuit section 11. The predriver 17 is operated by a low power supply $LV_{DD}$ (3V in this case). Signals with a voltage of 3V from the circuit section 11 are input to the predriver 17, then the signals of 3V are output to a first part 19a of the level shifter 19.

The level shifter 19 is an example of a voltage converting section that converts signals of 3V into 5V. The level shifter 19 includes a first part 19a and a second part 19b. The power supply of the first part 19a is a low power supply $LV_{DD}$ (3V in this case). Signals of 3V from the predriver 17 are input to the first part 19a and the signals of 3V are output to the second part 19b. The power supply of the second part 19b is a high power supply $HV_{DD}$ (5V in this case). Signals of 3V from the first part 19a are input to the second part 19b, which then outputs signals of 5V.

The driver 21 converts the signal current from the second part 19b of the level shifter 19 into a current required for driving an external device. The power supply of the driver 21 is a high power supply $HV_{DD}$ (5V in this case).

The port 13 of FIG. 1B is an input port (input cell). Signals of 5V from the external device input from the pad electrode 15 are converted into signals of 3V and transmitted to the circuit section 11. More specifically, the port 13 of FIG. 1B is provided with a level shifter 23.

The level shifter 23 is an example of a voltage converting section and converts signals of 5V into 3V. The level shifter 23 includes a first part 23a and a second part 23b. Signals of 5V from the pad electrode 15 are input to the first part 23a and signals of 3V are output to the second part 23b. The signals of 3V are input to the second part 23b and output to the circuit section 11. The power supply of the first part 23a and the second part 23b is a low power supply $LV_{DD}$ (3V in this case).

The port 13 of FIG. 1C is an output port (output cell). In this configuration, the port 13 outputs signals of 3V from the circuit section 11 to an external device through a pad electrode 15 without converting the signals. More specifically, the port 13 of FIG. 1C is provided with a predriver 17 and a driver 21 having a low power supply $LV_{DD}$ (3V in this case). The port 13 of FIG. 1C has the same configuration as the port 13 of FIG. 1A, except that the level shifter of the port 13 of FIG. 1A is removed.

The port 13 of FIG. 1D is an input port (input cell). Here, the port 13 output port transmits voltage signals (3V) from an external device through a pad electrode 15 to the circuit section 11, without converting. The port 13 of FIG. 1D is not provided with a predriver, level shifter, and driver.

The port 13 of FIG. 2A is an input/output port (input/output cell). In this configuration, the port 13 converts signals of 3V voltage from the circuit section 11 into signals of 5V voltage, and outputs to an external device through a pad electrode 15. In addition, signals of 5V from the external device input through the pad electrode 15 are converted into signals of 3V and transmitted to the circuit section 11. More specifically, the port 13 of FIG. 2A is provided with the components of the port 13 of FIG. 1A, which is an output port, and the components of the port 13 of FIG. 1B, which is an input port. A switch circuit 25 is connected with the pad electrode 15 and selects either an output port or input port. The switch circuit 25 may not be required in an alternative embodiment, and the port 13 of FIG. 2A can be formed without the switch circuit 25.

The port 13 of FIG. 2B is an input/output port (input/output cell). In this configuration, the port 13 outputs signals of voltage (3V) from the circuit section 11 to an external device through a pad electrode 15, without converting. In addition, the port 13 transmits voltage signals (3V) that are input from an external device through a pad electrode 15 to the circuit section 11 without converting. More specifically, the port 13 of FIG. 2B is provided with the components of the port 13 of FIG. 1C, which is an output port, and the components of the port 13 of FIG. 1D, which is an input port. A switch circuit 25 is connected with the pad electrode 15 and selects either an output port or an input port.

The region A in FIGS. 1 and 2 is a region where the predriver 17, the first part 19a of the level shifter 19, and the second part 23b of the level shifter 23 are formed. The region B is a region where the second part 19b of the level shifter 19, the first part 23a of the level shifter 23 and the driver 21 are formed. The region B is located outside the region A on the semiconductor substrate.

A number of MOS field effect transistors that are typically field effect transistors are formed in the regions A and B. These MOS field effect transistors are the components for the predriver 17, and level shifters 19, 23, and the driver 21. A voltage of 3V is applied to the gate electrode of the MOS field effect transistors formed in the region A. The thickness of gate oxide film of the MOS field effect transistors located in the region A is comparatively small (e.g. 70 Å). On the other hand, a voltage of 3V or 5V is applied to the gate electrodes of the MOS field effect transistors formed in the region B. The thickness of gate oxide film of the MOS field effect transistors located in the region B is comparatively large (e.g. 135 Å).

Because a voltage of 3V is applied to the gate electrodes of MOS field effect transistors of the region A, the gate oxide film can be comparatively small. This ensures high speed for the components located in the region A (the predriver 17, the first part 19a of the level shifter 19, the second part 23b of the level shifter 23), giving rise to an increase in the speed of the port 13. On the other hand, either a voltage of 3V or a voltage of 5V is applied to the gate electrodes of MOS field effect transistors of the region B. For this reason, the gate oxide film of the MOS field effect transistors of the region B must be comparatively large. If the gate oxide film is comparatively thin, the gate oxide film of the MOS field effect transistors in which a voltage of 5V is applied to their gate electrodes is easily broken.

Furthermore, the region on the semiconductor integrated circuit device 1 is divided into two regions along a double-dot and dash line shown FIGS. 1 and 3. In one of the two regions, the MOS field effect transistors having a comparatively thin gate oxide film are formed (i.e., the region A), and in the other region, the MOS field effect transistors having a comparatively thick gate oxide film are formed (i.e., the region B). A gate array and an embedded array can also be applied to the port 13 in this manner.

In FIGS. 1 and 2, the MOS field effect transistors are also formed in the regions in which the predriver 17, the level shifter 19, 23, and the driver 21 are not formed. However, the MOS field effect transistors do not operate because they are not connected with a wiring layer.

Next, an example of the MOS field effect transistor used in this embodiment will be described. FIG. 4A is a sectional view of one example of the MOS field effect transistor formed in the region A. FIG. 4B is a sectional view of one example of the MOS field effect transistor formed in the region B. Each of the MOS field effect transistors 1000 and 2000 comprises a silicon substrate 100, a gate electrode 300 formed through a gate oxide film 400 on the silicon substrate 100, source/drain regions 200a and 200b formed in the surface of the silicon substrate 100, and side walls 500 formed on the sides of the gate electrode 300.

The MOS field effect transistor 1000 has a gate oxide film 400 which is thinner than that of the MOS field effect transistor 2000. The film thickness of the gate oxide film 400 of the MOS field effect transistor 1000 may preferably be 70 Å. The film thickness of the gate oxide film 400 of the MOS field effect transistor 2000 may preferably be 135 Å. The film thickness of each of the gate oxide films 400 shown above as an example may be applicable when voltages of 3V and 5V are applied to their gate electrodes, respectively. If a different voltage is applied to a gate electrode, a preferable film thickness for the gate oxide film 400 may also vary.

An example of the method of fabricating the gate oxide film 400 will now be explained. First, a silicon oxide film is formed to a thickness of about 65 Å on the silicon substrate 100 by thermal oxidation, for example. Next, a resist is formed on the silicon oxide film. An aperture for exposing a region for forming the gate oxide film 400 of the MOS field effect transistor 1000 is formed in the resist. The silicon oxide film in this region is removed by etching using the resist as a mask. The resist is removed after the etching. Then, a silicon oxide film is formed to a thickness of about 70 Å on the silicon substrate 100 by thermal oxidation, for example. The gate oxide films 400 with different film thickness are formed by the above process.

Another example of the method of fabricating the gate oxide film 400 will be explained. First, a silicon oxide film is formed on the silicon substrate 100 by thermal oxidation, for example. The thickness of this silicon oxide film (135 Å) is the same as the thickness of the gate oxide film 400 of the MOS field effect transistor 2000. Next, a resist is formed on the silicon oxide film. An aperture for exposing a region for forming the gate oxide film 400 of the MOS field effect transistor 1000 is formed in the resist.

Then, the silicon oxide film is selectively cut by etching using the resist as a mask until the thickness of the silicon oxide film is equal to the thickness of the gate oxide film 400 (70 Å) of the MOS field effect transistor 1000. The resist is removed after the etching. The gate oxide films 400 with different film thickness are formed by the above process.

Although two different voltages are used for operating the semiconductor integrated circuit device 1 in the above embodiments, three or more types of voltages may be used. In addition, one type of voltage is also applicable to this embodiments when the operating voltage of the circuit section 11 (for example, 3V) differs from the operating voltage of the external device (for example, 5V). In such a case, the port 13 operating at a voltage of 3V shown in FIGS. 1C, 1D, and 2B can be omitted.

In addition, although the voltage is converted using the level shifters 19 and 23 in the semiconductor integrated circuit device 1, the driver 21 can also convert voltage. The level shifters 19 and 23 can be omitted in this instance.

What is claimed is:

1. A master slice type semiconductor integrated circuit device comprising a semiconductor substrate on which a circuit section is formed, and a port section being connected with the circuit section and functioning as at least one of an input port and an output port, wherein:

the port section is provided with a voltage converting section for converting a first voltage into a second voltage that differs from the first voltage;

the voltage converting section includes a first section having a first field effect transistor, and a second section having a second field effect transistor; and a gate insulating layer of the first field effect transistor has a film thickness that differs from a film thickness of a gate insulating layer of the second field effect transistor.

2. The semiconductor integrated circuit device according to claim 1, wherein the port section functions as an output port, and includes a predriver for inputting and outputting a first voltage signal, and a driver for inputting and outputting a second voltage signal.

3. The semiconductor integrated circuit device according to claim 2, wherein:

the voltage converting section comprises a level shifter;
the first section of the voltage converting section comprises a first part of
the level shifter;
the first voltage signal is input into and output from the first part of the level shifter;
the second section of the voltage converting section comprises a second part of the level shifter; and
the first voltage signal is input into and the second voltage signal is output from the second part of the level shifter.

4. The semiconductor integrated circuit device according to claim 3, wherein:

the predriver is connected with the circuit section and the first part of the level shifter; and the driver is connected with the second part of the level shifter.

5. The semiconductor integrated circuit device according to claim 4, wherein:
the thickness of a gate insulating layer of the field effect transistor being a component of the predriver, is equal to the thickness of a gate insulating layer of the first field effect transistor being a component of the first part of the level shifter; and
the thickness of a gate insulating layer of the field effect transistor being a component of the driver, is equal to the thickness of a gate insulating layer of the second field effect transistor being a component of the second part of the level shifter.

6. The semiconductor integrated circuit device according to claim 5, wherein:
the circuit section is operated by the first voltage; and
the thickness of a gate insulating layer of the field effect transistor being a component of the circuit section, the thickness of the gate insulating layer of the field effect transistor being the component of the predriver, and the thickness of the gate insulating layer of the first field effect transistor being the component of the first part of the level shifter are equal to one another.

7. The semiconductor integrated circuit device according to claim 6, wherein the predriver and the first part of the level shifter are formed in a region that is located between a region where the circuit section is formed and a region where the driver and the second part of the level shifter are formed.

8. The semiconductor integrated circuit device according to claim 7,
wherein on the semiconductor substrate,
the predriver and the first part of the level shifter are formed in a region that is located outside a region where the circuit section is formed, and
the driver and the second part of the level shifter are formed in a region that is located outside a region where the predriver and the first part of the level shifter are formed.

9. The semiconductor integrated circuit device according to claim 1,
wherein the port section functions as an input port.

10. The semiconductor integrated circuit device according to claim 9, wherein:
the voltage converting section comprises a level shifter;
the first section of the voltage converting section comprises a second part of the level shifter;
the first voltage signal is input into and output from the second part of the level shifter;
the second section of the voltage converting section comprises a first part of the level shifter; and
the second voltage signal is input into and the first voltage signal is output from the first part of the level shifter.

11. The semiconductor integrated circuit device according to claim 10, wherein:
the circuit section is operated by the first voltage; and
the thickness of a gate insulating layer of the field effect transistor being a component of the circuit section is equal to the thickness of a gate insulating layer of the first field effect transistor being a component of the second part of the level shifter.

12. The semiconductor integrated circuit device according to claim 11,
wherein the second part of the level shifter is formed in a region that is located between a region where the circuit section is formed and a region where the first part of the level shifter is formed.

13. The semiconductor integrated circuit device according to claim 12,
wherein on the semiconductor substrate,
the second part of the level shifter is formed in a region that is located outside a region where the circuit section is formed, and
the first part of the level shifter is formed in a region that is located outside a region where the second part of the level shifter is formed.

14. The semiconductor integrated circuit device according to claim 1, wherein the port section has a function as an input port and an output port.

15. The semiconductor integrated circuit device according to claim 14, wherein:
the port section is provided with another voltage converting section;
the input port of the port section comprises the another voltage converting section; and
the output port of the port section comprises the voltage converting section.

16. The semiconductor integrated circuit device according to claim 15, wherein:
the another voltage converting section comprises a first section having a third field effect transistor, and a second section having a fourth field effect transistor;
the gate insulating layer of the third field effect transistor has the same thickness as the gate insulating layer of the first field effect transistor; and
the gate insulating layer of the fourth field effect transistor has the same thickness as the gate insulating layer of the second field effect transistor.

17. The semiconductor integrated circuit device according to claim 16, wherein:
the voltage converting section includes a level shifter having a first part and a second part;
the another voltage converting section includes another level shifter having a first part and a second part;
the first section of the voltage converting section includes the first part of the level shifter;
the first voltage signal is input into and output from the first part of the level shifter;
the second section of the voltage converting section includes the second part of the level shifter;
the first voltage signal is input into and the second voltage signal is output from the second part of the level shifter;
the first section of the another voltage converting section includes the second part of the another level shifter;
the first voltage signal is input into and output from the second part of the another level shifter;
the second section of the another voltage converting section comprises a first part of the other level shifter; and
the second voltage signal is input into and the first voltage signal is output from the first part of the another level shifter.

18. The semiconductor integrated circuit device according to claim 17, wherein:
the port section comprises a predriver for inputting and outputting a first voltage, and a driver for inputting and outputting a second voltage;

the input port of the port section includes the another level shifter; and the output port of the port section includes the predriver, the driver, and the level shifter.

19. The semiconductor integrated circuit device according to claim 18, wherein:

the predriver is connected with the circuit section and the first part of the level shifter; and the driver is connected with the second part of the level shifter.

20. The semiconductor integrated circuit device according to claim 19, wherein:

the thickness of a gate insulating layer of the field effect transistor being a component of the predriver, the thickness of a gate insulating layer of the first field effect transistor being a component of the first part of the level shifter, and the thickness of a gate insulating layer of the third field effect transistor being a component of the second part of the other level shifter, are equal to one another; and the thickness of a gate insulating layer of the field effect transistor being a component of the driver, the thickness of a gate insulating layer of the second field effect transistor being a component of the second part of the level shifter, and the thickness of a gate insulating layer of the fourth field effect transistor being a component of the first part of the other level shifter, are equal to one another.

21. The semiconductor integrated circuit device according to claim 20, wherein:

the circuit section is operated by the first voltage; and the thickness of a gate insulating layer of the field effect transistor being a component of the circuit section, the thickness of the gate insulating layer of the field effect transistor being the component of the predriver, and the thickness of the gate insulating layer of the first field effect transistor being the component of the first part of the level shifter, and the thickness of the gate insulating layer of the third field effect transistor being the component of the second part of the other level shifter, are equal to one another.

22. The semiconductor integrated circuit device according to claim 21, wherein the predriver, the first part of the level shifter, and the second part of the other level shifter are formed in a region that is located between a region where the circuit section is formed and a region where the driver, the second part of the level shifter, and the first part of the other level shifter are formed.

23. The semiconductor integrated circuit device according to claim 22, wherein on the semiconductor substrate, the predriver, the first part of the level shifter, and the second part of the other level shifter are formed in a region that is located outside the region where the circuit section is formed, and the driver, the second part of the level shifter, and the first part of the other level shifter are formed in a region that is located outside the region where the predriver, the first part of the level shifter, and the second part of the other level shifter are formed.

24. The semiconductor integrated circuit device according to claim 1, wherein the circuit section and the port section comprise at least one of a gate array and an embedded array.

25. The semiconductor integrated circuit device according to claim 1, further comprising another port section, wherein the another port section has a function of not converting a voltage.

26. The semiconductor integrated circuit device according to claim 25, wherein the other port section is provided with a predriver and another driver, and functions as an output port.

27. The semiconductor integrated circuit device according to claim 26, wherein:

the thickness of a gate insulating layer of the field effect transistor being a component of the other predriver, the thickness of the gate insulating layer of the field effect transistor being the component of the predriver, and the thickness of the gate insulating layer of the first field effect transistor being the component of the first part of the level shifter are equal to one another; and the thickness of a gate insulating layer of the field effect transistor being a component of the other driver, the thickness of the gate insulating is layer of the field effect transistor being the component of the driver, and the thickness of the gate insulating layer of the second field effect transistor being the component of the second part of the level shifter are equal to one another.

28. The semiconductor integrated circuit device according to claim 1, wherein:

the second voltage is greater than the first voltage; and the thickness of the gate insulating layer of the second field effect transistor is greater than the thickness of the gate insulating layer of the first field effect transistor.

29. A master slice type semiconductor integrated circuit device comprising a semiconductor substrate on which a circuit section is formed, and a port section being connected with the circuit section and functioning as at least an output port, wherein:

the port section converts a first voltage into a second voltage which differs from the first voltage;

the port section includes a first section having a first field effect transistor, and second section having a second field effect transistor; and a gate insulating layer of the first field effect transistor has a film thickness that differs from a film thickness of a gate insulating layer of the second field effect transistor.

30. The semiconductor integrated circuit device according to claim 29, wherein:

the port section is provided with a predriver and a driver; a first voltage signal is input into and output from the predriver; and the driver converts the first voltage into a second voltage which differs from the first voltage, and the first voltage signal is input into and a second voltage signal is output from the driver.

31. The semiconductor integrated circuit device according to claim 30, wherein:

the predriver includes the first section having the first field effect transistor; and the driver includes the second section having the second field effect transistor.

32. The semiconductor integrated circuit device according to claim 31, wherein the predriver is formed in a region that is located between a region where the circuit section is formed and a region where the driver is formed.

33. The semiconductor integrated circuit device according to claim 32, wherein on the semiconductor substrate, the predriver is formed in a region that is located outside a region where the circuit section is formed, and the driver is formed in a region that is located outside a region where the predriver is formed.

* * * * *